(12) United States Patent
Wang et al.

(10) Patent No.: US 12,159,926 B2
(45) Date of Patent: *Dec. 3, 2024

(54) LATERAL BIPOLAR TRANSISTOR

(71) Applicant: GLOBALFOUNDRIES U.S. Inc., Malta, NY (US)

(72) Inventors: Haiting Wang, Clifton Park, NY (US); Alexander Derrickson, Troy, NY (US); Jagar Singh, Clifton Park, NY (US); Vibhor Jain, Williston, VT (US); Andreas Knorr, Saratoga Springs, NY (US); Alexander Martin, Greenfield Center, NY (US); Judson R. Holt, Ballston Lake, NY (US); Zhenyu Hu, Clifton Park, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/373,598

(22) Filed: Sep. 27, 2023

(65) Prior Publication Data
US 2024/0021713 A1    Jan. 18, 2024

Related U.S. Application Data

(63) Continuation of application No. 17/509,384, filed on Oct. 25, 2021, now Pat. No. 11,810,969.

(Continued)

(51) Int. Cl.
*H01L 29/735*    (2006.01)
*H01L 29/08*    (2006.01)
(Continued)

(52) U.S. Cl.
CPC ........ *H01L 29/735* (2013.01); *H01L 29/0808* (2013.01); *H01L 29/0821* (2013.01);
(Continued)

(58) Field of Classification Search
CPC .............. H01L 29/735; H01L 29/0808; H01L 29/0821; H01L 29/41708; H01L 29/6625;
(Continued)

(56) References Cited

U.S. PATENT DOCUMENTS 7,897,995 B2    3/2011   Yang et al.
7,943,995 B2    5/2011   Kang et al.
(Continued)

OTHER PUBLICATIONS

Yau et al., "SiGe-on-insulator symmetric lateral bipolar transistors," IEEE SOI-3D-Subthreshold Microelectronics Technology Unified Conference (S3S), Nov. 23, 2015, 2 pages.
(Continued)

*Primary Examiner* — Syed I Gheyas
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a lateral bipolar transistor and methods of manufacture. A structure includes: an intrinsic base comprising semiconductor material in a channel region of a semiconductor substrate; an extrinsic base vertically above the intrinsic base; a raised collector region on the semiconductor substrate and laterally connected to the intrinsic base; and a raised emitter region on the semiconductor substate and laterally connected to the intrinsic base.

19 Claims, 8 Drawing Sheets

Related U.S. Application Data

(60) Provisional application No. 63/237,250, filed on Aug. 26, 2021.

(51) Int. Cl.
  *H01L 29/417* (2006.01)
  *H01L 29/66* (2006.01)
  *H01L 29/737* (2006.01)

(52) U.S. Cl.
  CPC .... *H01L 29/41708* (2013.01); *H01L 29/6625* (2013.01); *H01L 29/737* (2013.01)

(58) Field of Classification Search
  CPC ............... H01L 29/737; H01L 21/8249; H01L 27/0623; H01L 29/1008; H01L 29/66242; H01L 29/7317
  See application file for complete search history.

(56) References Cited

U.S. PATENT DOCUMENTS

| | | | |
|---|---|---|---|
| 8,288,758 B2 | 10/2012 | Ning et al. | |
| 8,310,027 B2 | 11/2012 | Russ et al. | |
| 8,906,755 B1 | 12/2014 | Hekmatshoartabari et al. | |
| 9,059,016 B1 | 6/2015 | Hekmatshoar-Tabari et al. | |
| 9,059,195 B2 | 6/2015 | Cai et al. | |
| 9,263,583 B2 | 2/2016 | Cai et al. | |
| 9,502,504 B2 * | 11/2016 | Cai | H01L 29/1008 |
| 9,536,788 B1 | 1/2017 | Ning et al. | |
| 9,553,145 B2 | 1/2017 | Harame et al. | |
| 9,748,369 B2 | 8/2017 | Liu | |
| 9,786,656 B1 | 10/2017 | Anderson et al. | |
| 9,887,278 B2 * | 2/2018 | Cai | H01L 29/6625 |
| 2002/0142558 A1 | 10/2002 | Hsu | |
| 2006/0060941 A1 | 3/2006 | Sun et al. | |
| 2013/0256757 A1 * | 10/2013 | Cai | H01L 29/42304 257/E29.188 |
| 2013/0260526 A1 | 10/2013 | Cai et al. | |
| 2015/0097247 A1 | 4/2015 | Cai et al. | |
| 2015/0102348 A1 | 4/2015 | Cai et al. | |
| 2015/0236093 A1 | 8/2015 | Chan et al. | |
| 2015/0303185 A1 | 10/2015 | Preisler et al. | |
| 2016/0276807 A1 | 9/2016 | Cai et al. | |
| 2018/0083126 A1 | 3/2018 | Hashemi et al. | |
| 2023/0061219 A1 | 3/2023 | Wang et al. | |
| 2023/0062747 A1 | 3/2023 | Gu et al. | |

OTHER PUBLICATIONS

Raman et al., "On the Performance of Lateral SiGe Heterojunction Bipolar Transistors With Partially Depleted Base" IEEE Transactions on Electron Devices, vol. 62, No. 8, Aug. 2015, 7 pages.

* cited by examiner

LATERAL BIPOLAR TRANSISTOR

FIELD OF THE INVENTION

The present disclosure relates to semiconductor structures and, more particularly, to a lateral bipolar transistor and methods of manufacture.

BACKGROUND

Bipolar transistors can be vertical transistors or lateral transistors. In a vertical bipolar transistor, carriers flow in a vertical direction. Since a collector region is formed in a position deep from a wafer surface, an emitter-collector resistance increases, thus making the transistor disadvantageous for high-speed operation. In addition, the transistor requires a high-concentration buried layer, a collector epitaxial layer, and a deep trench isolation, etc. Consequently, the number of process steps increases, thus increasing costs.

On the other hand, the lateral bipolar transistor is simpler in structure than the vertical bipolar transistor. Also, in a lateral bipolar transistor, a collector electrode can be directly brought into contact with a collector region, which is advantageous for high-speed operation. However, current integration schemes may result in high Ccb (parasitic capacitance) and high Rb, which is a concern in bipolar technologies as it limits device scaling for improved fT/fMAX.

SUMMARY

In an aspect of the disclosure, a structure comprises: an intrinsic base comprising semiconductor material in a channel region of a semiconductor substrate; an extrinsic base vertically above the intrinsic base; a raised collector region on the semiconductor substrate and laterally connected to the intrinsic base; and a raised emitter region on the semiconductor substate and laterally connected to the intrinsic base.

In an aspect of the disclosure, a structure comprising" a lateral heterojunction bipolar transistor on a substrate material, the lateral heterojunction bipolar transistor comprising: an intrinsic base region in a channel region of the substrate material; an extrinsic base region over the intrinsic base region; a raised collector region comprising epitaxial semiconductor material adjacent to the extrinsic base; and a raised emitter region comprising the epitaxial semiconductor material adjacent to the extrinsic base; and a gate structure on the substrate material, the gate structure comprising a gate material and raised source/drain regions comprising the epitaxial semiconductor material; and isolation regions which isolate the gate structure from the lateral heterojunction bipolar transistor.

In an aspect of the disclosure, a method comprises: forming an intrinsic base comprising semiconductor material in a channel region of a semiconductor substrate; forming an extrinsic base vertically above the intrinsic base; forming a raised collector region on the semiconductor substrate and laterally connected to the intrinsic base; and forming a raised emitter region on the semiconductor substate and laterally connected to the intrinsic base.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a lateral bipolar transistor and methods of manufacture. More specifically, the lateral bipolar transistor is formed by a self-aligned trench on a fully depleted semiconductor on insulator (FDSOI) substrate. Advantageously, the lateral bipolar transistor minimizes parasitic capacitance and provides tunability based on a base width, e.g., base width (Wb) of <20 nm defined by a separate patterning which allows tunability.

In embodiments, the lateral bipolar transistor may be a lateral NPN heterojunction transistor comprising a SiGe intrinsic base laterally connected to an emitter and collector. The SiGe intrinsic base will provide Ft/Fmax improvement due to a smaller SiGe bandgap. The lateral bipolar transistor also includes an extrinsic base vertically above the intrinsic base. Spacers are formed on either side of the extrinsic base to provide isolation from the emitter and collector regions. Also, a silicide, e.g., NiSi, may be formed on the extrinsic base for improved base contact. The intrinsic base can be SiGe extending into a recess in a channel of a semiconductor on insulator (SOI) substrate, while allowing maximum tuning freedom using an intrinsic base width (<20 nm) (without degradation of bipolar device). In embodiments, the base width is much smaller than a CMOS gate width (Lg). The lateral bipolar transistor can be fabricated on a same chip together with a planar CMOS device, especially for RF SOC (>1 THz) applications.

The lateral bipolar transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the lateral bipolar transistor of the present disclosure have been adopted from integrated circuit (IC) technology. For example, the structures are built on wafers and are realized in films of material patterned by photolithographic processes on the top of a wafer. In particular, the fabrication of the lateral bipolar transistor uses three basic building blocks: (i) deposition of thin films of material on a substrate, (ii) applying a patterned mask on top of the films by photolithographic imaging, and (iii) etching the films selectively to the mask.

Figure 1:
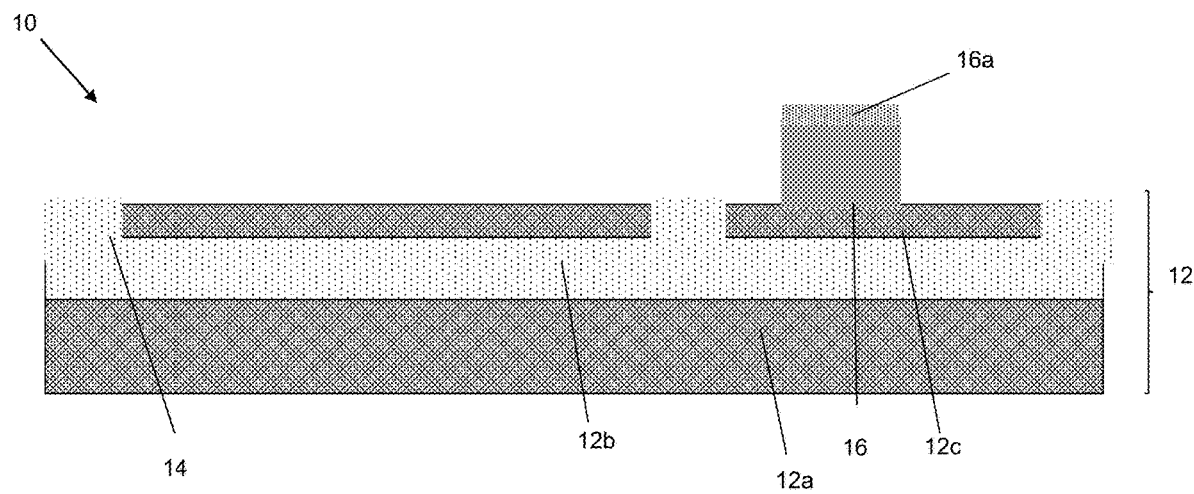
FIG. 1 shows a substrate and gate structure, amongst other features, and respective fabrication processes in accordance with aspects of the present disclosure.

FIG. 1 shows a substrate and gate structure, amongst other features, and respective fabrication processes in accordance with aspects of the present disclosure. More specifically, the structure 10 includes a substrate 12 and gate structure 16 composed of work function metals, polysilicon material and a gate dielectric material. In embodiments, a cap layer 16a may be formed on a top surface of the gate structure 16, e.g., polysilicon material. The cap layer 16a may be composed of an oxide liner and a nitride cap material on the oxide liner, as one non-limiting illustrative example. The gate dielectric material may be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Although not critical to the understanding of the present disclosure, the gate structure 16 may be fabricated using conventional CMOS processes. For example, the gate structure 16 may be fabricated using standard CMOS or replacement gate processes. In the standard CMOS processing, e.g., gate first process, the gate materials, e.g., gate dielectric, work function metal, polysilicon, and cap layer 16a are formed, e.g., deposited, onto the substrate 12, followed a patterning process. The patterning process may be a conventional etching process such as a reactive ion etching (RIE) to form a stack of materials comprising the gate structure 16.

The substrate 12 is preferably a fully depleted semiconductor-on-insulator (FDSOI) substrate. For example, the substrate 12 includes a semiconductor handle substrate 12a, an insulator layer 12b and a semiconductor layer 12c. In embodiments, the semiconductor handle substrate 12a and semiconductor layer 12c may be composed of any suitable material including, but not limited to, Si, SiGe, SiGeC, SiC, GaAs, InAs, InP, and other II/VV or II/VI compound semiconductors. The semiconductor handle substrate 12a may be a p-substrate. The semiconductor layer 12c may also comprise any suitable crystallographic orientation (e.g., a (100), (110), (111), or (001) crystallographic orientation). The semiconductor layer 12c may be deposited to various thicknesses (Tsi), depending on the desired device performance, which will be used as a channel region for subsequently formed devices. The insulator layer 12b may include a dielectric material such as silicon dioxide, silicon nitride, silicon oxynitride, boron nitride or a combination thereof and, preferably, a buried oxide layer (BOX) supported on the semiconductor handle substrate 12a.

Still referring to FIG. 1, shallow trench isolation structures 14 are formed in the semiconductor layer 12c, extending to the insulator layer 12b. The shallow trench isolation structures 14 can be formed by conventional lithography, etching and deposition methods known to those of skill in the art. For example, a resist formed over the semiconductor layer 12c is exposed to energy (light) to form a pattern (opening). An etching process with a selective chemistry, e.g., RIE, will be used to transfer the pattern from the patterned resist layer to the semiconductor layer 12c to form one or more trenches in the semiconductor layer 12c through the openings of the resist. Following the resist removal by a conventional oxygen ashing process or other known stripants, insulator material (e.g., oxide based material) can be deposited by any conventional deposition processes, e.g., chemical vapor deposition (CVD) processes. Any residual material on the surface of the semiconductor layer 12c may be removed by conventional chemical mechanical polishing (CMP) processes.

Figure 2:
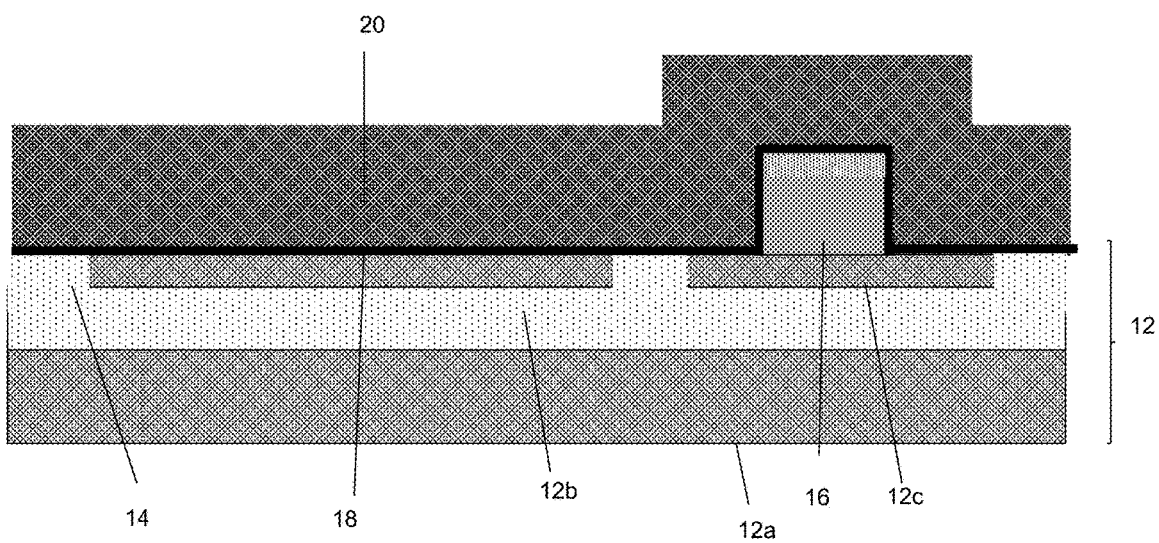
FIG. 2 shows a liner encapsulating the gate structure, amongst other features, and respective fabrication processes in accordance with aspects of the present disclosure.

In FIG. 2, a liner 18 is formed on the semiconductor layer 12c and over the gate structure 16. In embodiments, the liner 18 encapsulates the gate structure 16. The liner 18 may be an oxide material that is blanket deposited on the semiconductor layer 12c and the gate structure 16. A hardmask 20 may be formed over the liner 18. In embodiments, the hardmask 20 may be blanket deposited by conventional deposition processes, e.g., CVD, over the liner 18. The hardmask 20 may be, for example, SiCN.

Figure 3:
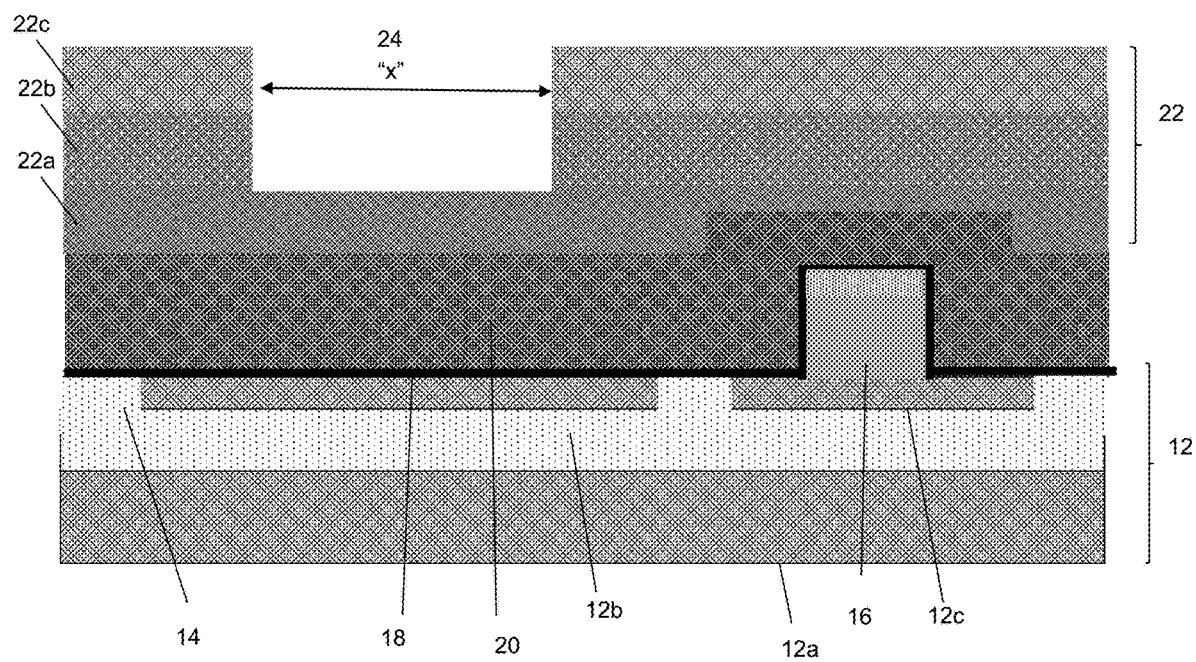
FIG. 3 shows an opening in a stack of materials formed over a hardmask, amongst other features, and respective fabrication processes in accordance with aspects of the present disclosure.

As further shown in FIG. 3, a stack of materials 22 may be formed over the hardmask 20. The stack of materials 22 may include a stack of materials used in lithography and etching processes. For example, the stack of materials 22 may comprise SOH 22a, SiON 22b and an anti-reflective coating 22c (e.g., bottom anti-reflective coating (BARC)). An opening 24 may be formed in the anti-reflective coating 22c and material 22b using conventional lithography and etching processes as already described herein. In embodiments, the opening 24 has a cross section of "x". In embodiments, the cross section "x" may be a minimum critical dimension, e.g., approximately 20 nm to 50 nm in width or diameter. The opening 24 may also extend partly into the material 22a.

Figure 4:
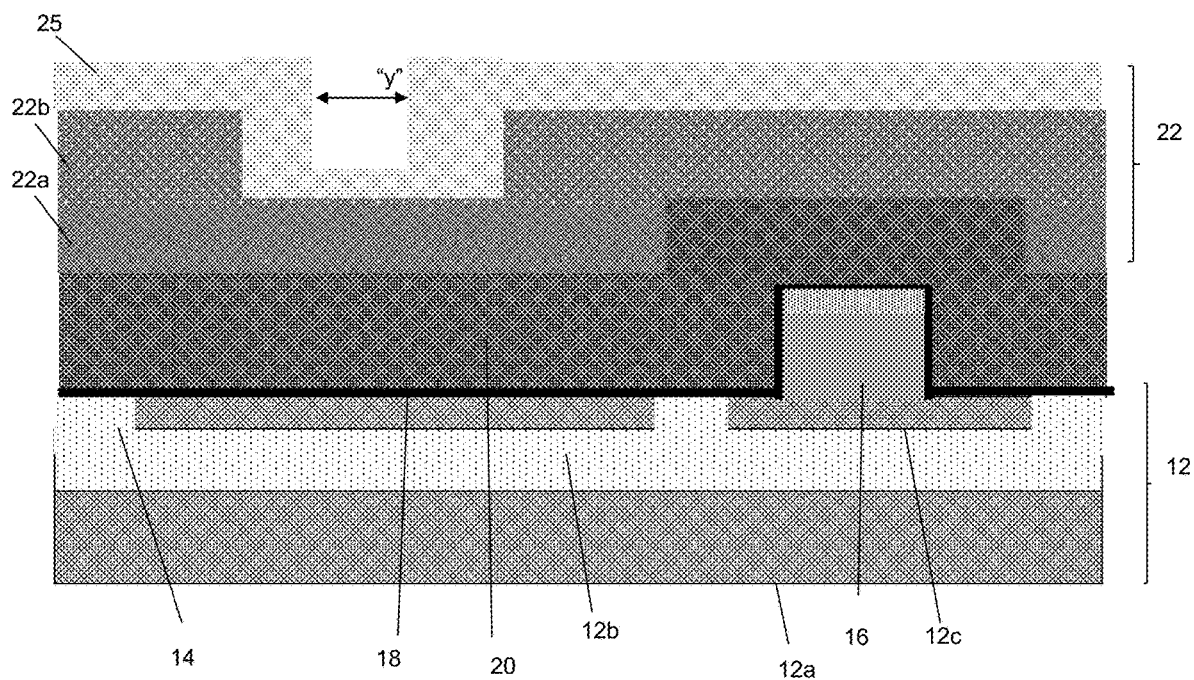
FIG. 4 shows an inner spacer material formed within the opening, amongst other features, and respective fabrication processes in accordance with aspects of the present disclosure.

In FIG. 4, the anti-reflective coating 22c may be removed using known stripants. An inner spacer material 25 may formed over the material 22b and within the opening 24. The inner spacer material 25 may be an oxide material, for example. The inner spacer material 25 may be deposited by a conventional deposition process such as CVD. As should be understood by those of skill in the art, the inner spacer material 24 will effectively reduce the cross section of the opening to a dimension "y". In embodiments, dimension "y" is tunable based on the thickness of the inner spacer material 24. For example, a thicker inner spacer material 25 will reduce the dimension "y"; whereas a thinner inner spacer material 25 will increase the dimension "y".

Figure 5:
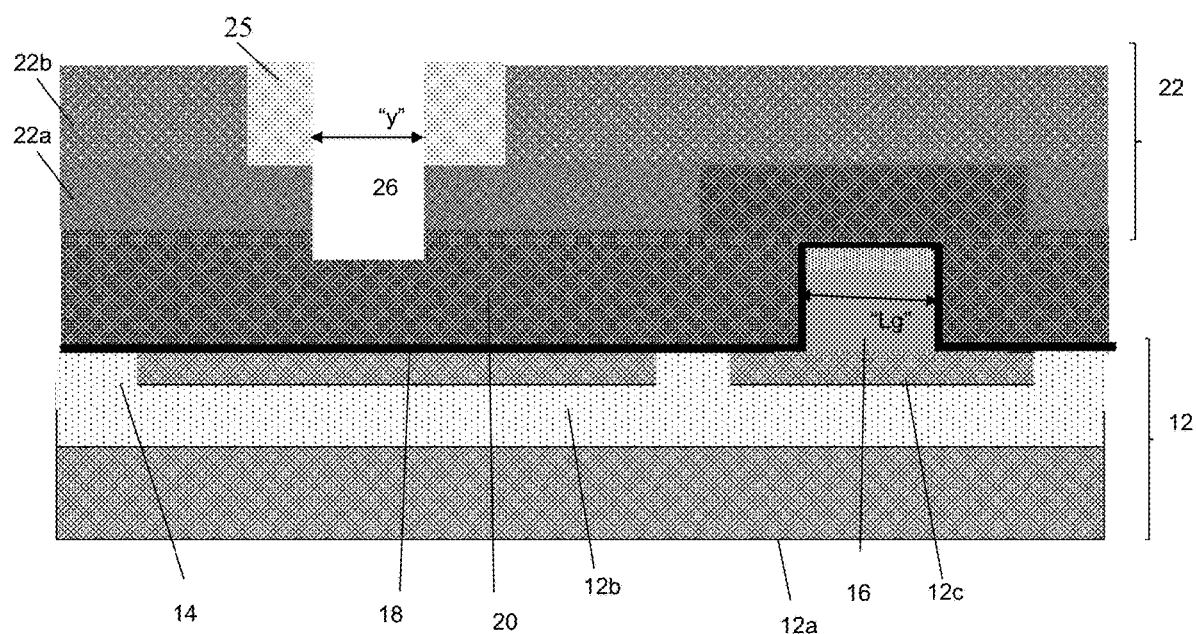
FIG. 5 shows a smaller opening in the stack of materials, amongst other features, and respective fabrication processes in accordance with aspects of the present disclosure.

In FIG. 5, dimension "y" may be transferred to the material 22a through an etching process which forms opening 26. In this process, the etching process will remove the horizontal surfaces of the inner spacer material 24 within and outside of the opening and extend such opening 26 into the material 22a. In embodiments, the opening 26 may also extend partially within the hardmask 20. The dimension "y" may be approximately 20 nm or less; although this dimension is tunable to other cross sectional dimensions, e.g., diameters or widths. In further embodiments, the dimension "y" is less than a gate length (Lg) of the gate structure 16.

Figure 6:
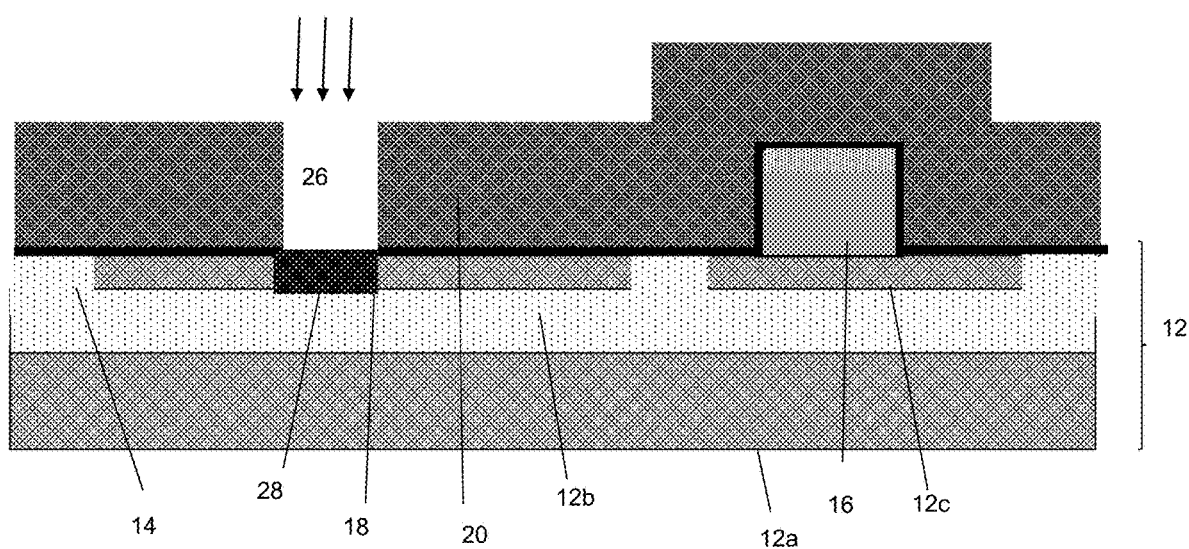
FIG. 6 shows an isolation region formed in the substrate through the smaller opening, amongst other features, and respective fabrication processes in accordance with aspects of the present disclosure.

As further shown in FIG. 6, the opening 26 (and its dimension of "y") may be extended through the hardmask 20, exposing the liner 18. The material 22b and the inner spacer material 25 may be removed by conventional etching or stripping processes. The underlying semiconductor substrate 12c may be subjected to an ion implantation process, as shown by the arrows, to form an isolation region 28 within a channel region of the semiconductor substrate 12c.

In embodiments, the ion implantation is a lightly doped P+ implant, e.g., $BF_2$, in the underlying semiconductor substrate 12c using conventional ion implantation processes.

Figure 7:
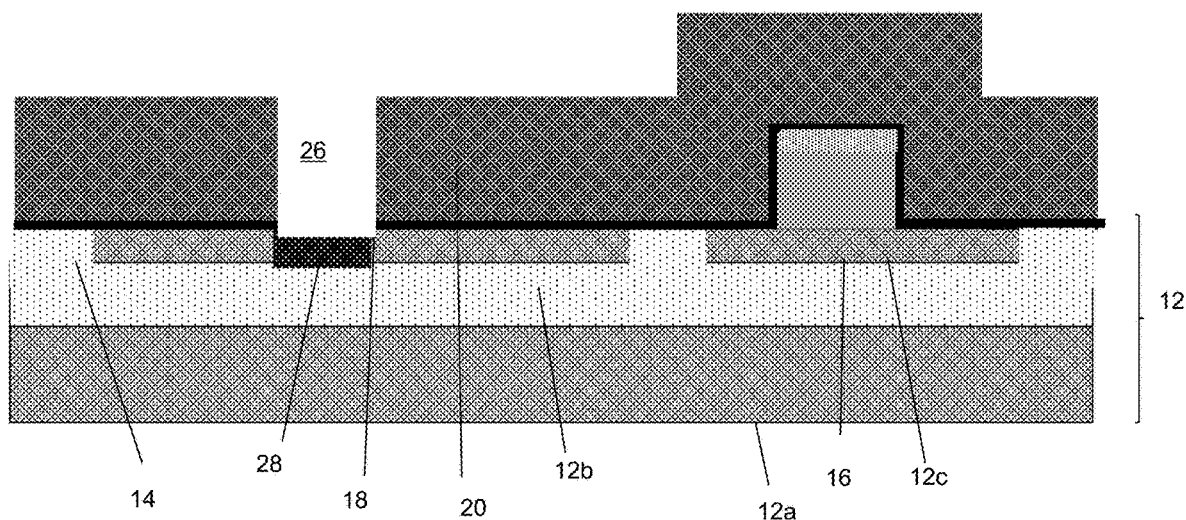
FIG. 7 shows the underlying substrate exposed in the smaller opening, amongst other features, and respective fabrication processes in accordance with aspects of the present disclosure.

In FIG. 7, the exposed liner 18 within the opening 26 may be removed by a conventional etching process. The isolation region 28 may also be thinned or recessed to tune an intrinsic base that will be formed over the isolation region 28 in subsequent fabrication processes.

Figure 8:
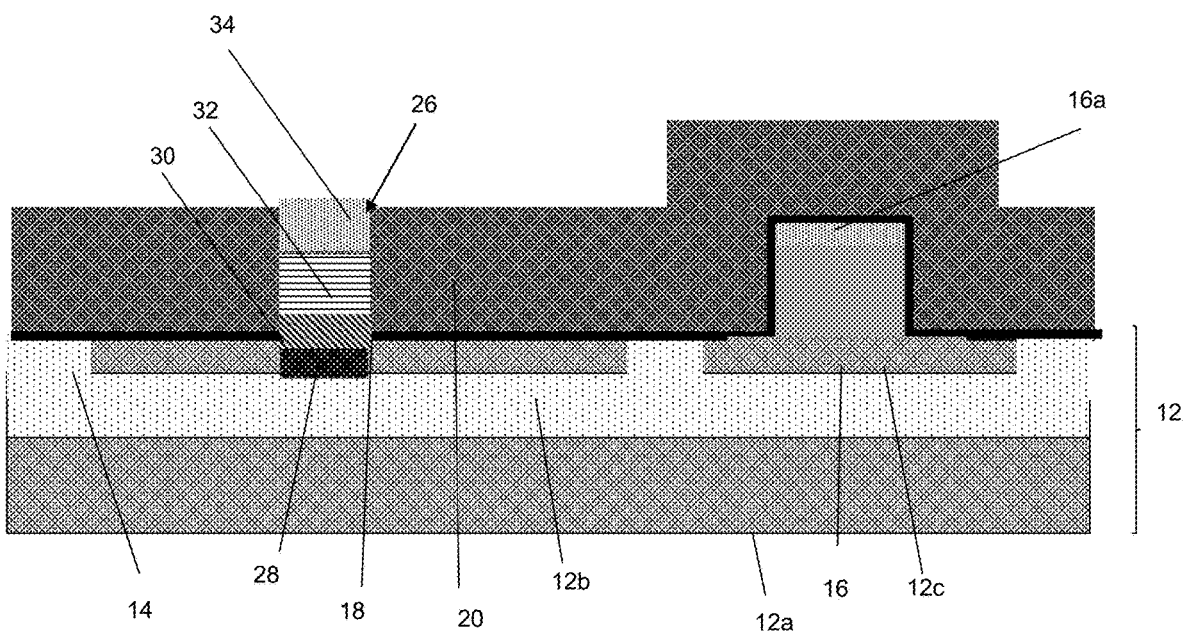
FIG. 8 shows an intrinsic base and extrinsic based formed in the smaller opening, amongst other features, and respective fabrication processes in accordance with aspects of the present disclosure.

As shown in FIG. 8, a semiconductor material 30, e.g., intrinsic base, may be formed within the opening 26, followed by a semiconductor material 32, e.g., extrinsic base, and a cap material 34 within the opening 26. In embodiments, the opening 26 allows self-alignment of the semiconductor material 30, e.g., intrinsic base, the semiconductor material 32, e.g., extrinsic base, and the cap material 34, each of which now has a dimension "y" of the opening 26.

The semiconductor material 30, e.g., intrinsic base, may be undoped SiGe material formed within the recessed portion of the channel region, i.e., over the isolation region 28 aligned with the opening 26. The semiconductor material 32, e.g., extrinsic base, may be P+ doped Si material, as an example, also formed in the opening 26. Moreover, both the semiconductor material 30, e.g., intrinsic base, and the semiconductor material 32, e.g., extrinsic base, may be epitaxially grown semiconductor material, with the P+ doping of the semiconductor material 32 performed in situ as an example. The cap material 34 is preferably the same material as the cap layer 16a of the gate structure 16, e.g., oxide/nitride. A CMP or non-selective etching process may be performed to remove any excess cap material 34 on the hardmask 20.

As should be understood by those of skill in the art, the semiconductor material 30, e.g., intrinsic base, and the semiconductor material 32, e.g., extrinsic base, may both be tunable by adjusting their width and/or thickness. For example, a larger opening 26 would result in a wider base width; whereas a smaller opening would result in a narrower base width. Similarly, a thickness of the isolation region 28 may be tuned to provide more or less semiconductor material 30, e.g., intrinsic base, and the semiconductor material 32, e.g., extrinsic base. For example, a thinner isolation region 28 in the channel region would result in a thicker intrinsic base and a thicker isolation region 28 would result in a thinner intrinsic base.

Figure 9:
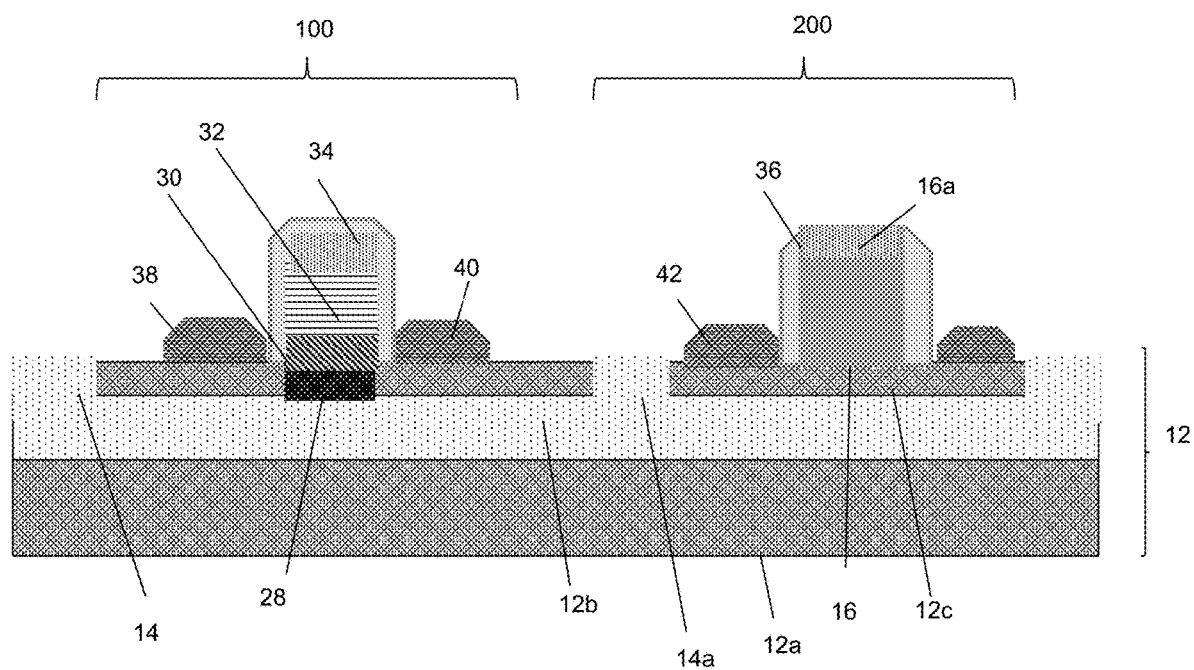
FIG. 9 shows raised epitaxial regions on sides of the extrinsic based and gate structure, amongst other features, and respective fabrication processes in accordance with aspects of the present disclosure.

As further shown in FIG. 9, the hardmask 20 and liner 18 may be removed, e.g., stripped, using conventional etching or stripping processes. In this way, both the extrinsic base material 28 (with cap material 32) and the gate structure 16 (with the cap layer 16a) are exposed. Sidewall spacers 36 are formed on sidewalls of the extrinsic base material 28 and the gate structure 16. In embodiments, the sidewall spacers 36 may be a low k-spacer material, i.e., oxide, formed by a conventional blanket deposition process, followed by an anisotropic etching process. Advantageously, the sidewall spacers 36 on the sidewalls of the extrinsic base material 28 and the gate structure 16 can be formed in the same fabrication processes.

A raised emitter region 38 and raised collector region 40 may be formed on sides of the sidewall spacer 36 of the extrinsic base, e.g., semiconductor material 32, to form a lateral bipolar transistor 100. More specifically, the raised emitter region 38 and raised collector region 40 may be N+ doped semiconductor material, thus forming an NPN lateral heterojunction bipolar transistor 100. In embodiments, the intrinsic base 30 may be laterally connected to the raised emitter region 38 and raised collector region 40.

FIG. 9 further shows raised source/drain regions 42 formed on sides of the sidewall spacer 36 of the gate structure 16 to form a planar CMOS transistor 200. In embodiments, the raised emitter region 38, raised collector region 40 and raised source/drain regions 42 may be formed by an epitaxial growth process. For example, the raised emitter region 38, raised collector region 40 and raised source/drain regions 42 may be formed from Si material and, preferably, N+ doped Si material, using a same conventional selective epitaxial growth process.

Figure 10:
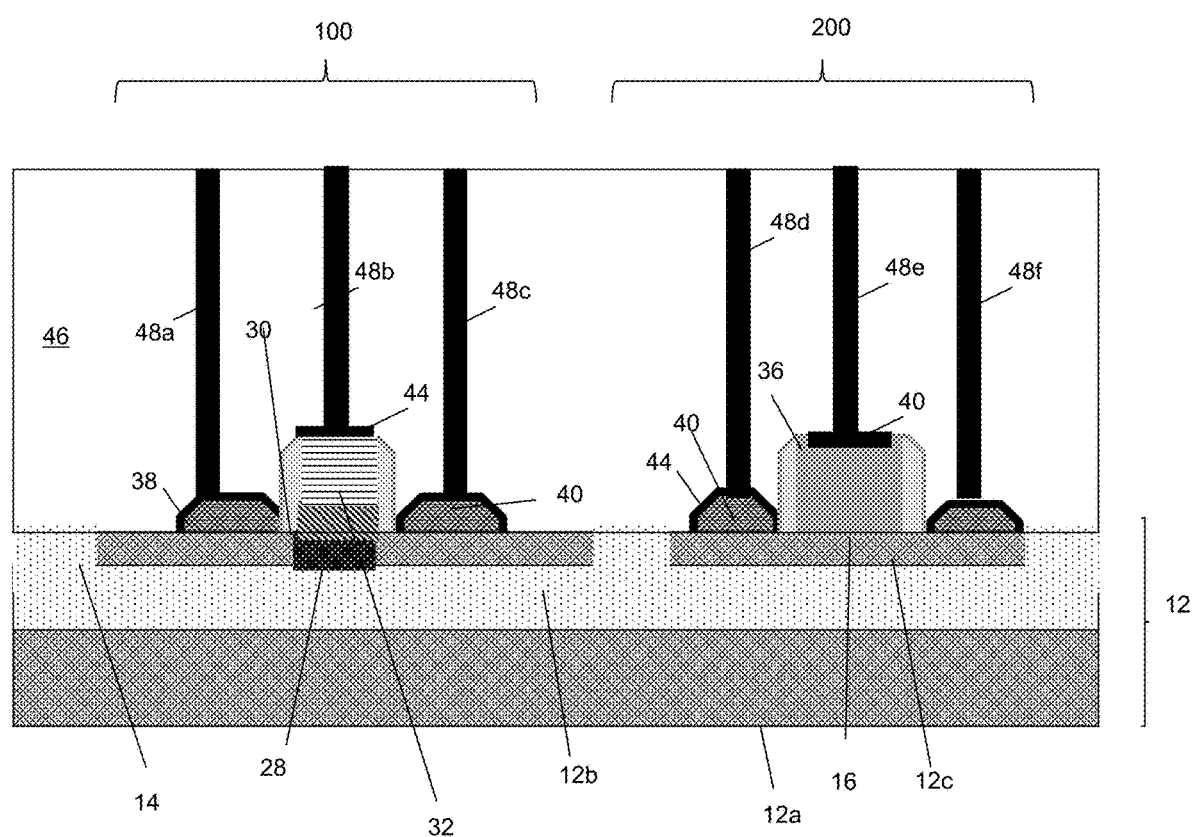
FIG. 10 shows a silicide and contacts to a lateral bipolar transistor and a CMOS transistor, amongst other features, and respective fabrication processes in accordance with aspects of the present disclosure.

In FIG. 10, the cap material 32 and the cap layer 16a may be removed by a stripping process, e.g., nitride hardmask strip process known to those of skill in the art. A silicide 44 may be formed on the exposed semiconductor material 32 (e.g., extrinsic base), and the polysilicon gate material of the gate structure 16, in addition to the raised emitter region 38, raised collector region 40 and raised source/drain regions 42. In embodiments, the silicide 44 provides improved base contact, hence providing a lower base resistance compared to conventional structures.

As should be understood by those of skill in the art, the silicide process begins with deposition of a thin transition metal layer, e.g., nickel, cobalt or titanium, over fully formed and patterned semiconductor devices (e.g., semiconductor material 32, polysilicon material and raised epitaxial regions 38, 40, 42). After deposition of the material, the structure is heated allowing the transition metal to react with exposed silicon (or other semiconductor material as described herein) in the active regions of the devices forming a low-resistance transition metal silicide. Following the reaction, any remaining transition metal is removed by chemical etching, leaving silicide contacts 44 in the active regions of the device.

Still referring to FIG. 10, contacts 48a-48f are formed on the silicide contacts 44. In embodiments, the contacts 48a-48f are formed by conventional lithography, etching and deposition processes within interlevel dielectric material 46. In embodiments, the interlevel dielectric material 46 may be a stack of materials, e.g., oxide and nitride.

By way of more specific example, the interlevel dielectric material 46 may be deposited by conventional CVD processes, followed by trench formation to expose the silence contacts 44 of the semiconductor material 32 (e.g., extrinsic base), emitter region 38, and collector region 40 of the lateral bipolar transistor 100, in addition to the epitaxial source/drain regions 42 and polysilicon material of the gate structure 16 of the CMOS transistor 200. A conductive material, e.g., aluminum or tungsten, may be deposited within the trenches to form the contacts 48a-48f to the respective regions 38, 32, 40, 33, 36. Any excessive conductive material may be removed from the surface of the interlevel dielectric material 46 by a conventional CMP process.

The lateral bipolar transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an intrinsic base;
   an extrinsic base above the intrinsic base;
   a raised collector region with respect to a semiconductor substrate, the raised collector region being electrically connected to the intrinsic base; and
   a raised emitter region with respect to the semiconductor substrate, the raised emitter region being electrically connected to the intrinsic base,
   wherein the intrinsic base is at least partially recessed in the semiconductor substate adjacent the raised emitter region.

2. The structure of claim 1, wherein the intrinsic base comprises semiconductor material of a channel region comprising the semiconductor substrate.

3. The structure of claim 1, wherein the raised collector region is provided on a semiconductor substrate and is laterally connected to the intrinsic base.

4. The structure of claim 1, wherein the raised emitter region is on a semiconductor substate and is laterally connected to the intrinsic base.

5. The structure of claim 1, wherein the intrinsic base comprises SiGe.

6. The structure of claim 5, wherein the semiconductor substate comprises semiconductor on insulator material with a P+ isolation region in a channel region.

7. The structure of claim 6, wherein the P+ isolation region comprises a recess and the intrinsic base is located in the recess.

8. The structure of claim 1, further comprising a gate structure, wherein a width of the intrinsic base is less than a gate length of the gate structure.

9. The structure of claim 8, wherein the gate structure comprises epitaxial raised source/drain regions comprising a same material as the raised collector region and the raised emitter region.

10. The structure of claim 1, further comprising a sidewall spacer on sidewalls of the extrinsic base, the sidewall spacer isolated the extrinsic base from both the raised collector region and the raised emitter region.

11. The structure of claim 1, wherein the raised collector region and the raised emitter region comprise N+ doped semiconductor material and the extrinsic base comprises a P+ doped semiconductor material, and the N+ doped semiconductor material and the P+ doped semiconductor material comprises a lateral NPN heterojunction transistor.

12. A structure comprising:
    an intrinsic base region in a channel region of a substrate material;
    an extrinsic base region vertically over the intrinsic base region;
    a raised collector region comprising semiconductor material adjacent to the extrinsic base and over and contacting a semiconductor on insulator layer;
    a raised emitter region comprising the semiconductor material adjacent to the extrinsic base and over and contacting the semiconductor on insulator layer; and
    a gate structure comprising a gate material and raised source/drain regions comprising the semiconductor material.

13. The structure of claim 12, wherein the intrinsic base region, the extrinsic base region, the raised collector region and the raised emitter region comprise a lateral heterojunction bipolar transistor.

14. The structure of claim 13, further comprising isolation regions which isolate the gate structure from the lateral heterojunction bipolar transistor.

15. The structure of claim 13, wherein the lateral heterojunction bipolar transistor comprises an NPN lateral heterojunction bipolar transistor.

16. The structure of claim 12, wherein the semiconductor material of the raised emitter region and the raised collector region comprise N+ doped semiconductor material and the extrinsic base comprises a P+ doped semiconductor material.

17. The structure of claim 13, wherein the raised source/drain regions comprise N+ doped semiconductor material and a width of the intrinsic base is less than a length of the gate structure.

18. The structure of claim 12, wherein the extrinsic base region is isolated from the raised collector region and the raised emitter region by a sidewall spacer material on sidewalls of the extrinsic base region.

19. A method comprising:
    forming an intrinsic base;
    forming an extrinsic base above the intrinsic base;
    forming a raised collector region with respect to a semiconductor substrate, the raised collector region being electrically connected to the intrinsic base; and
    forming a raised emitter region with respect to the semiconductor substrate, the raised emitter region being electrically connected to the intrinsic base,
    wherein the intrinsic base is at least partially recessed in the underlying semiconductor substate.

* * * * *